PULSE TIMING CIRCUIT

Filed May 10, 1961

INVENTOR.
EMILE J. DAIGLE JR.
BY
Carl V. Olson
ATTORNEY

United States Patent Office 3,073,971
Patented Jan. 15, 1963

3,073,971

PULSE TIMING CIRCUIT

Emile J. Daigle, Jr., Philadelphia, Pa., assignor to Radio Corporation of America, a corporation of Delaware Filed May 10, 1961, Ser. No. 109,153

8 Claims. (Cl. 307—88.5)

Figure 1:
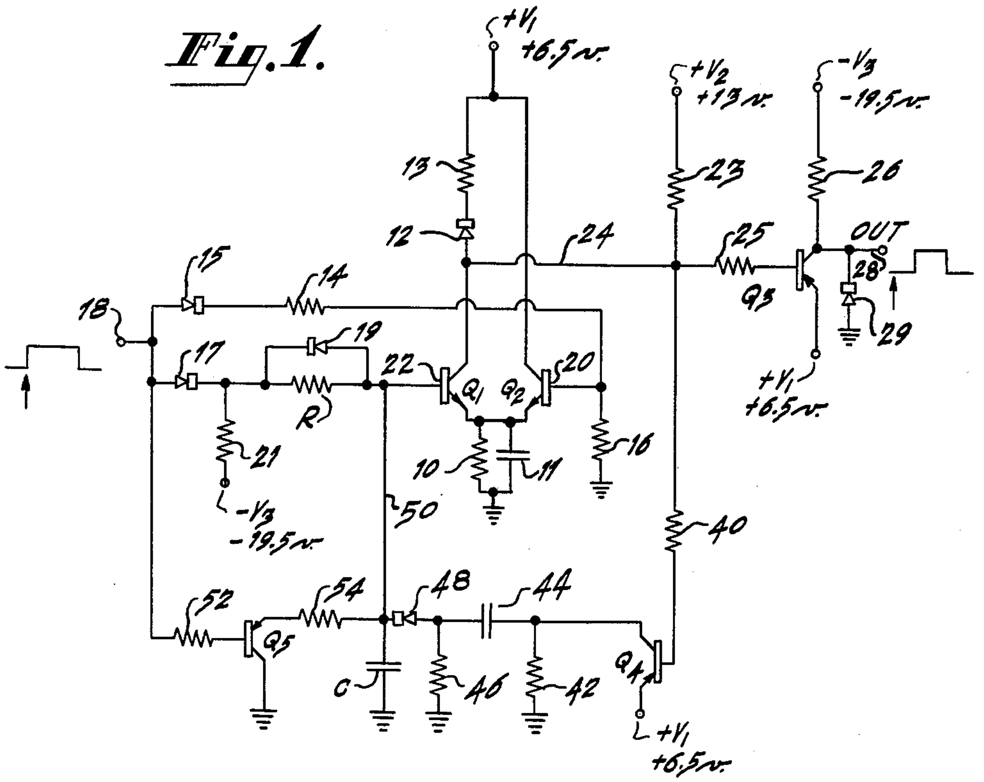

This invention relates to timing circuits capable of translating an input signal voltage transition to a delayed output signal voltage transition. More specifically, the invention relates to a stabilized timing circuit providing an output pulse having a leading edge which is delayed in time relative to the leading edge of an input pulse. While not limited thereto, the invention is particularly useful in the magnetic tape station and logic portions of electronic data processing apparatus.

It is an object of this invention to provide an improved timing circuit of the type wherein an output voltage transition is delayed relative to an input voltage pulse transition by a stable, predetermined amount which is substantially unaffected by the amplitude of the input signal pulse.

It is another object to provide an improved timing circuit which provides a highly accurate and stable delay between output and input signals.

It is a further object to provide a timing circuit which generates an output signal pulse having relatively steep leading and trailing edges.

The present invention is an improvement on a timing circuit of the type wherein there is provided a differential amplifier having first and second inputs and having an output. A timing circuit input terminal is coupled by means of a voltage divider network to a first or reference input of the differential amplifier. The timing circuit input terminal is also coupled through a resistor-capacitor integrator to a second or signal input terminal of the differential amplifier. An input pulse applied to the timing circuit input terminal establishes a proportionate reference voltage on the first or reference input of the differential amplifier. The input signal pulse also results in the application of a gradually increasing voltage to the second or signal input of the differential amplifier through an action of the integrator. When the voltage applied to the second or signal input of the amplifier equals and exceeds the voltage applied to the first or reference input, the differential amplifier provides an output voltage transition. The output voltage transition occurs at a stable fixed time delay following the input voltage transition, over a very large range of the amplitude of the input signal pulse, because of the proportional relationship between the reference and time delayed signals applied to the two inputs of the differential amplifier.

Briefly, the improved circuit according to the present invention includes a transistor switch and a differentiator coupled from the output of the differential amplifier to the second or signal input of the differential amplifier for the purpose of providing a positive feedback voltage spike which shortens the rise time of the output voltage transition from the differential amplifier. The circuit also includes a transistor switch coupled between the integrator and the timing circuit input terminal to rapidly discharge the capacitor in the integrator circuit at the time of occurrence of the trailing edge of an input pulse applied to the timing circuit input terminal.

Figure 2:
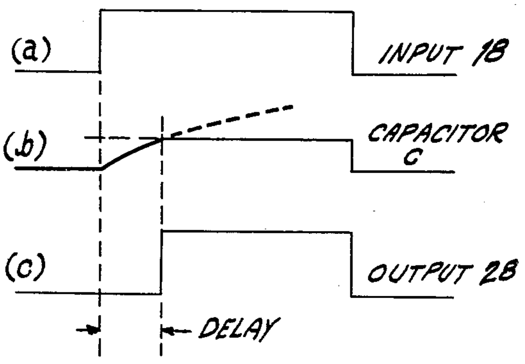

These and other objects and aspects of the invention will be apparent to those skilled in the art from the following more detailed description taken in conjunction with the appended drawings, wherein:

FIGURE 1 is a circuit diagram of an improved timing circuit constructed according to the teachings of this invention; and FIGURE 2 is a chart of voltage waveforms which will be referred to in describing the operation of the circuit of FIGURE 1.

The timing circuit of FIGURE 1 includes two NPN transistors $Q_1$ and $Q_2$ which are connected to form a differential amplifier. The emitters of transistors are connected together and through an emitter resistor 10 in parallel with a capacitor 11 to a point of reference potential. The collector of transistor $Q_1$ is connected through a diode 12 and an output resistor 13 to a point $+V_1$ of positive voltage relative to the reference voltage. The collector of transistor $Q_2$ is connected directly to the positive voltage terminal $+V_1$.

A voltage divider including a diode 15 and resistors 14 and 16 is coupled between the timing circuit input terminal 18 and the base input terminal 20 of transistor $Q_2$. A resistor-capacitor integrator, including resistor R and capacitor C, is coupled by diode 17 between the timing circuit input terminal 18 and the base input terminal 22 of the transistor $Q_1$. A unidirectional conducting device such as a diode 19 is connected in shunt with the resistor R. The junction between the diode 17 and the resistor R is connected through a resistor 21 to the negative terminal $-V_3$ of a bias voltage source. The diode 19 and resistor 21 provide a path to the bias terminal $-V_3$ for the leakage current of the transistor $Q_1$ when the transistor is cut-off.

An output 24 from the differential amplifier is taken from the collector of the transistor $Q_1$ and applied through a resistor 23 to a $+V_2$ bias terminal, and through a resistor 25 to the base input terminal of a transistor $Q_3$ which is connected in an emitter follower circuit. The emitter follower circuit includes a $+V_1$ terminal from which a positive bias voltage is applied to the emitter of the PNP transistor $Q_3$, and an output resistor 26 connected from the collector of the transistor $Q_3$ to a bias voltage terminal $-V_3$. The output 28 of the timing circuit of FIGURE 1 is prevented from falling below a reference potential by means of a clamping diode 29.

The output 24 of the differential amplifier is also coupled through a resistor 40 to the base electrode of a PNP switching transistor $Q_4$. The emitter electrode of transistor $Q_4$ is directly connected to the $+V_1$ bias voltage source. The collector of transistor $Q_4$ is connected through a bleeder resistor 42 to ground, and is connected to a differentiator including capacitor 44 and resistor 46. The output of the differentiator is coupled to a disconnect diode 48 and the lead 50 to the base electrode 22 of the transistor $Q_1$. The diode 48 prevents the differentiating circuit from affecting the R–C time constant of resistor R and capacitor C. The transistor $Q_4$ and the differentiator 44, 46 are thus seen to be coupled from the output of the differential amplifier $Q_1$, $Q_2$ to the signal input terminal 22 of the differential amplifier. A PNP switching transistor $Q_5$ is coupled between the timing circuit input terminal 18 and the capacitor C of the integrator R, C. The base of the transistor $Q_5$ is coupled to the circuit input terminal 18 through a resistor 52. The collector of transistor $Q_5$ is connected directly to ground. The internal emitter-collector circuit of the transistor $Q_5$ is connected, by means of a resistor 54, in shunt with the capacitor C.

The operation of the circuit of FIGURE 1 will be described with reference also to the voltage waveforms of FIGURE 2. The transistors $Q_1$, $Q_2$, $Q_3$, $Q_4$ and $Q_5$ are biased to be cut-off or substantially nonconducting in the absence of an input signal at the input terminal 18. The input terminal may be at ground or a negative level when the input signal is absent. The bias on the collector of transistor $Q_2$ is determined by the voltage divider including resistor 23, diode 12 and resistor 13. When a positive input pulse, such as is represented by waveform *a* of FIGURE 2, is applied to the input terminal 18, a proportion of the input pulse voltage is applied to the input base electrode 20 of the transistor $Q_2$. The proportion is determined primarily by the values of the voltage divider resistors 14 and 16. By way of example, the resistors 14 and 16 may be equal in value, with the result that the voltage applied to the base of transistor $Q_2$ is equal to half the voltage of the input pulse. The base 20 of transistor $Q_2$ is the reference voltage input of the differential amplifier including transistors $Q_1$ and $Q_2$. The proportional reference voltage applied to the base of transistor $Q_2$ causes the transistor $Q_2$ to conduct heavily so that a voltage drop is developed across the emitter resistor 10 which biases the emitters of both transistors $Q_1$ and $Q_2$ at a positive value such as 3½ volts. This emitter bias maintains the other transistor $Q_1$ in the cut-off or substantially nonconducting condition.

When the positive input pulse is applied to the input terminal 18, there is also a flow of current through the diode 17 and resistor R into the capacitor C of the resistor-capacitor integrator. The voltage on the capacitor C builds up exponentially in the manner shown by the waveform *b* of FIGURE 2. When the voltage capacitor C equals and exceeds the half-value reference voltage applied to the base 20 of the transistor $Q_2$, the transistor $Q_1$ becomes conductive also. When the transistor $Q_1$ becomes conducting, a negative voltage transition is generated at the output 24, and is applied to the base of transistor $Q_3$. This causes transistor $Q_3$ to switch to the conducting state and generate a positive output voltage at the output 28, as represented by the voltage waveform *c* of FIGURE 2.

The negative voltage transition at the output 24 of the differential amplifier is also applied through the resistor 40 to the base of the normally nonconducting transistor $Q_4$. The negative voltage transition on the base switches the transistor $Q_4$ to the highly conducting condition wherein current flows from the $+V_1$ terminal, through the emitter-collector circuit of transistor $Q_4$ and through the capacitor 44 of the differentiator 44, 46. The differentiator causes the generation of a sharp positive spike which is applied through the diode 48 and the line 50 to the base 22 of the transistor $Q_1$. The positive voltage spike causes differential amplifier transistor $Q_1$ to conduct very hard immediately after it has started to conduct by reason of the voltage on its base 22 equaling and exceeding the voltage on the base 20 of transistor $Q_2$. The effect of the feedback loop provided by the transistor $Q_4$ and the differentiator 44, 46 is to make the leading edge of the output pulse very abrupt and steep.

At the trailing edge of the input pulse applied to the timing circuit input terminal 18, the positive voltage applied to the bases 20 and 22 of transistors $Q_2$ and $Q_1$ are removed with the result that the transistors return to their cut-off or nonconducting states. The cutting off of the transistors $Q_2$ and $Q_1$ is speeded by the simultaneous action of the transistor $Q_5$ in discharging the integrator capacitor C. The transistor $Q_5$ begins conducting as soon as the input signal falls below the voltage charge on capacitor C. The negative-going trailing edge of the input pulse is coupled through resistor 52 to the base of normally nonconducting transistor $Q_5$ causing it to become fully conductive and to rapidly discharge the integrator capacitor C. After capacitor C is discharged to ground, transistor $Q_5$ returns to its normal nonconducting condition.

The cutting off of the differential amplifier transistor $Q_1$ results in a positive output voltage transition at the output 24 which is applied to the base of transistor $Q_3$, causing transistor $Q_3$ to also return to its nonconducting condition. It is thus seen that the trailing edge of the output pulse at output terminal 28 and as represented by the output waveform *c* of FIGURE 2 substantially coincides in time with the trailing edge of the input pulse applied to input terminal 18 and as shown by waveform *a* of FIGURE 2.

The diode 19 provides a low impedance by-pass around resistor R for base current of transistor $Q_1$ (in the path through resistor 21 to the $-V_3$ bias terminal) when the transistor $Q_1$ is nonconducting. Diode 17 prevents the voltage on the base of transistor $Q_1$ from feeding back and affecting the trailing edge of the input pulse when the capacitor C is discharged. Diode 15 is inserted in the path to the input 20 of transistor $Q_2$ to balance the presence of the diode 17 in the path to the input 22 of transistor $Q_1$. The capacitor 11 is employed in the emitter circuit of transistors $Q_1$ and $Q_2$ to prevent the appearance of a spike in the output 24 at the trailing edge of an input pulse applied to input terminal 18 which has a duration shorter than the timed delay provided by the integrator R, C.

It is thus seen that the timing circuit of FIGURE 1 provides an output pulse having a leading edge delayed a predetermined amount relative to the leading edge of the input pulse, and that the output pulse has a trailing edge substantially coincident with the trailing edge of the input pulse. The time delay between the leading edge of the input pulse and the leading edge of the output pulse, as illustrated in FIGURE 2, is determined by the values of resistance R and capacitance C in the integrator circuit.

Solely by way of example, a circuit according to FIGURE 1 provided a delay of 10 milliseconds when constructed with values of circuit elements as follows:

| | | |
|---|---|---|
| Resistor R | ohms | 15,000 |
| Resistor **10** | do | 681 |
| Resistor **13** | do | 2,700 |
| Resistor **14** | do | 1,000 |
| Resistor **16** | do | 1,000 |
| Resistor **21** | do | 180,000 |
| Resistor **23** | do | 15,000 |
| Resistor **25** | do | 1,000 |
| Resistor **26** | do | 4,700 |
| Resistor **40** | do | 1,000 |
| Resistor **42** | do | 1,000 |
| Resistor **46** | do | 1,000 |
| Resistor **52** | do | 510 |
| Resistor **54** | do | 20 |
| Capacitor C | microfarads | 1.0 |
| Capacitor **11** | do | 2.2 |
| Capacitor **44** | do | 0.047 |

What is claimed is:

1. A timing circuit comprising a signal input terminal, a differential amplifier having two inputs and an output, voltage divider means coupled between said signal input terminal and one of said differential amplifier inputs to apply a proportion of an input signal as a reference signal to said one input of the differential amplifier, an integrator coupled between said signal input terminal and the other input of said differential amplifier, said differential amplifier providing an output when the integrated signal exceeds the reference signal, and a differentiator coupled from the output of said differential amplifier to said other input of the differential amplifier to provide positive feedback for the purpose of shortening the rise time of the output.

2. A timing circuit comprising a signal input terminal, a differential amplifier having a first input, a second input and an output, voltage divider means coupled between said signal input terminal and said first input of said differential amplifier to apply a proportion of an input signal as a reference signal to said first input of the differential amplifier, a resistor-capacitor integrator coupled between said signal input terminal and said second input of the differential amplifier, said differential amplifier providing an output when the integrated signal exceeds the reference signal, a switching amplifier device and a differentiator coupled from the output of said differential amplifier to said second input of the differential amplifier to provide positive feedback for the purpose of shortening the rise time of the output.

3. A timing circuit comprising a signal input terminal, a transistor differential amplifier having a first input, a second input and an output, voltage divider means coupled between said signal input terminal and said first input of said differential amplifier to apply a proportion of an input signal as a reference signal to said first input of the differential amplifier, a resistor-capacitor integrator coupled between said signal input terminal and said second input of the differential amplifier, said differential amplifier providing an output when the integrated signal exceeds the reference signal, and a transistor, a differentiator and a diode coupled from the output of said differential amplifier to said second input of the differential amplifier to provide positive feedback for the purpose of shortening the rise time of the output, said diode being poled to prevent the flow of current from the integrator to the differentiator.

4. A timing circuit comprising a signal input terminal, a differential amplifier having two inputs and an output, voltage divider means coupled between said signal input terminal and one of said differential amplifier inputs to apply a proportion of an input signal as a reference signal to said one input of the differential amplifier, an integrator coupled between said signal input terminal and the other input of said differential amplifier, said differential amplifier providing an output when the integrated signal exceeds the reference signal, and a switching amplifier coupled between said integrator circuit and said timing circuit input terminal to rapidly reset said integrator circuit at the trailing edge of an input pulse.

5. A timing circuit comprising a signal input terminal, a differential amplifier having a first input, a second input and an output, voltage divider means coupled between said signal input terminal and said first input of said differential amplifier to apply a proportion of an input signal as a reference signal to said first input of the differential amplifier, a resistor-capacitor integrator coupled between said signal input terminal and said second input of the differential amplifier, said differential amplifier providing an output when the integrated signal exceeds the reference signal, and a switching amplifier device coupled between said integrator circuit and said timing circuit input terminal to rapidly discharge said capacitor at the trailing edge of an input pulse.

6. A timing circuit comprising a signal input terminal, a differential amplifier having two inputs and an output, voltage divider means coupled between said signal input terminal and one of said differential amplifier inputs to apply a proportion of an input signal as a reference signal to said one input of the differential amplifier, an integrator coupled between said signal input terminal and the other input of said differential amplifier, said differential amplifier providing an output when the integrated signal exceeds the reference signal, a differentiator coupled from the output of said differential amplifier to said other input of the differential amplifier to provide positive feedback for the purpose of shortening the rise time of the output, and a switching amplifier coupled between said integrator circuit and said timing circuit input terminal to rapidly reset said integrator circuit at the trailing edge of an input pulse.

7. A timing circuit comprising a signal input terminal, a differential amplifier having a first input, a second input and an output, voltage divider means coupled between said signal input terminal and said first input of said differential amplifier to apply a proportion of an input signal as a reference signal to said first input of the differential amplifier, a resistor-capacitor integrator coupled between said signal input terminal and said second input of the differential amplifier, said differential amplifier providing an output when the integrated signal exceeds the reference signal, a first switching amplifier device and a differentiator coupled from the output of said differential amplifier to said second input of the differential amplifier to provide positive feedback for the purpose of shortening the rise time of the output, and a second switching amplifier device coupled between said integrator circuit and said timing circuit input terminal to rapidly discharge said capacitor at the trailing edge of an input pulse.

8. A timing circuit comprising a signal input terminal, a transistor differential amplifier having a first input, a second input and an output, voltage divider means coupled between said signal input terminal and said first input of said differential amplifier to apply a proportion of an input signal as a reference signal to said first input of the differential amplifier, a resistor-capacitor integrator coupled between said signal input terminal and said second input of the differential amplifier, said differential amplifier providing an output when the integrated signal exceeds the reference signal, a first transistor, a differentiator and a diode coupled from the output of said differential amplifier to said second input of the differential amplifier to provide positive feedback for the purpose of shortening the rise time of the output, said diode being poled to prevent the flow of current from the integrator to the differentiator, and another transistor coupled between said integrator circuit and said timing circuit input terminal to rapidly discharge said capacitor at the trailing edge of an input pulse.

References Cited in the file of this patent

UNITED STATES PATENTS 2,987,632 Milford ---------------- June 6, 1961